(12) United States Patent
Krosschell (10) Patent No.: US 8,779,854 B2
(45) Date of Patent: Jul. 15, 2014

(54) VARIABLE GAIN AMPLIFIER CIRCUIT

(75) Inventor: Rob Krosschell, Herveld (NL)

(73) Assignee: NXP, B.V., Eindhoven (NL)

( * ) Notice: Subject to any disclaimer, the term of this patent is extended or adjusted under 35 U.S.C. 154(b) by 70 days.

(21) Appl. No.: 13/547,775

(22) Filed: Jul. 12, 2012

(65) Prior Publication Data

US 2013/0154746 A1    Jun. 20, 2013

(30) Foreign Application Priority Data

Jul. 12, 2011    (EP) ..................................... 11250654

(51) Int. Cl.
*H03F 3/45*    (2006.01)

(52) U.S. Cl.
CPC ...................................... *H03F 3/45* (2013.01)
USPC .......................................................... 330/254

(58) Field of Classification Search
CPC ........................................................ H03F 3/45
USPC .................................................. 330/254, 260
See application file for complete search history.

(56) References Cited

U.S. PATENT DOCUMENTS

| | | | |
|---|---|---|---|
| 5,999,053 | A | 12/1999 | Eschauzier |
| 6,215,989 | B1 | 4/2001 | Otaka |
| 2006/0132237 | A1 | 6/2006 | Zochios |

FOREIGN PATENT DOCUMENTS

EP    1 357 664 A2    10/2003

OTHER PUBLICATIONS

Kobayashi, K. W. et al. "A Monolithically Integrated HEMT-HBT Low Noise High Linearity Variable Gain Amplifier", IEEE Journal of Solid-State Circuits, vol. 31, No. 5, pp. 714-718 (May 1996).

Lee, H. D. et al "A SiGe BiCMOS Transmitter Module for IMT2000 Applications", IEEE Microwave and Wireless Components Letters, vol. 14, No. 8, pp. 371-373 (Aug. 2004).

Extended European Search Report for EP Patent Appln. No. 11250654.8 (Oct. 26, 2011).

*Primary Examiner* — Robert Pascal
*Assistant Examiner* — Khiem Nguyen (57) ABSTRACT

A variable gain amplifier circuit (300) comprising a first transistor (310) and a second transistor (312); and an additional transistor (320). The first transistor (310) and second transistor (312) are arranged as common base transistors. The additional transistor (320) is configured to provide part of a translinear loop with the first (310) and second transistors (310). A current through the conduction channel of the first transistor (310) is configured to contribute to an output of the variable gain amplifier circuit current. The circuit (300) is configured such that a current through the conduction channel of the second transistor (312) is copied to the additional transistor (322).

14 Claims, 5 Drawing Sheets

VARIABLE GAIN AMPLIFIER CIRCUIT

CROSS-REFERENCE TO RELATED APPLICATIONS

This application claims the priority under 35 U.S.C. §119 of European patent application no. 11250654.8, filed on Jul 12, 2011, the contents of which are incorporated by reference herein.

The present disclosure relates to the field of variable gain amplifier circuits, and in particular, although not exclusively, to variable gain amplifier circuits that have two common base transistors that form part of a translinear loop.

It is known to be advantageous to operate some variable gain amplifiers with a linear-in-decibels (linear-in-dB) gain curve. In this way a system feedback loop that senses the signal voltage or power with a logarithmic detector can be more readily implemented with the variable gain amplifier.

According to a first aspect of the invention, there is provided a variable gain amplifier circuit comprising:
  a first transistor and a second transistor, wherein the first transistor and second transistor are arranged as common base transistors; and
  an additional transistor that is configured to provide part of a translinear loop with the first and second transistors;
  wherein a current through the conduction channel of the first transistor is configured to contribute to an output of the variable gain amplifier circuit, and the circuit is configured such that a current through the conduction channel of the second transistor is copied to the additional transistor.

In this way, the variable current through the second transistor can be cancelled out from the translinear loop as it is also present in the additional transistor. This can be considered as compensating for at least part of a non-ideal transfer function of the first and second transistors and enable an increased linear-in-dB range of operation. In turn, this can lead to higher maximum gain value that can be achieved in linear-in-dB operation.

Linear-in-dB operation can be considered advantageous as a control voltage is often generated in a system feedback loop that senses a signal voltage or power with a logarithmic detector. Therefore, if the gain control curve has an exponential shape, which is equivalent to linear-in-dB operation, then the overall loop gain can be constant and independent of signal level.

The variable gain amplifier circuit may comprise a current steering cascode comprising the first transistor and the second transistor. The current steering cascode may also comprise a third transistor. The third transistor may be arranged as a common emitter transistor. The collector of the third transistor may be connected to the emitter of both the first and second transistors.

A cascode can be considered as the combination of a common emitter (CE) stage and a common base (CB) stage transistor, where the collector of the CE stage is connected to the emitter of the CB stage. A current steering cascode can be considered as a cascode with two CB stages connected to the collector of the CE stage, instead of one. The first transistor and second transistor of the variable gain amplifier circuit can be the two CB stages of the current steering cascode and the third transistor can be considered as the CE stage. The difference between the two base voltages of the CB stages can result in a difference between the collector currents of the CB stages. Therefore, the CB base voltage difference can control the CB collector current and thus the current gain.

The additional transistor may be configured such that current flows through its base-emitter junction in the opposite direction to current that flows through the base-emitter junction of the second transistor. In this way, the current though the additional transistor can be conveniently used to cancel out the current through the second transistor.

The circuit may comprise any component that is configured to copy the current through the conduction channel of the second transistor to the conduction channel of the additional transistor. In one example, the circuit may comprise a current mirror that is configured to copy the current through the conduction channel of the second transistor to the conduction channel of the additional transistor. In another example, the circuit may comprise two current mirrors that are configured to couple the current through the conduction channel of the second transistor to the additional transistor. Using two current mirrors can be advantageous as it enables the polarity of the current signal provided to the additional transistor to be properly set.

The circuit may further comprise a voltage source, or any circuit with a voltage output, that is configured to provide a control voltage for setting the gain of the variable gain amplifier circuit.

The circuit may further comprise a current source and a control transistor that provides part of the translinear loop. The current source may be configured to provide a current to the control transistor, the current having a value that has an exponential relationship with respect to the control voltage.

The circuit may further comprise a control transistor that provides part of the translinear loop and a further transistor. The conduction channel of the further transistor may be provided in series with the conduction channel of the control transistor. The further transistor may be configured to receive the control voltage at its base, and provide a current to the control transistor, the current having a value that has an exponential relationship with respect to the control voltage.

The further transistor may be independent of the translinear loop.

The variable gain amplifier circuit may include one or more extra transistors that are configured to form part of the translinear loop. The number of transistors that are arranged as having a current flow from base to emitter around the translinear loop may be equal to the number of transistors that are arranged as having a current flow from emitter to base around the translinear loop One or more, or all of the transistors may be bipolar junction transistors or CMOS transistors in weak inversion.

There may be provided an integrated circuit comprising any circuit disclosed herein.

There may be provided a computer program, which when run on a computer, causes the computer to configure any apparatus, including a circuit, integrated circuit, or device disclosed herein or perform any method disclosed herein. The computer program may be a software implementation, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software may be an assembly program.

The computer program may be provided on a computer readable medium, which may be a physical computer readable medium such as a disc or a memory device, or may be embodied as a transient signal. Such a transient signal may be a network download, including an Internet download.

A description is now given, by way of example only, with reference to the accompanying drawings, in which.

One or more embodiments disclosed herein relate to a variable gain amplifier circuit comprising a first transistor and a second transistor arranged as common base transistors. The first and second transistors may be part of a current steering cascode. A current through the conduction channel of the first transistor is configured to contribute to the output of the variable gain amplifier circuit. The circuit also includes an additional transistor that is configured to provide part of a translinear loop with the first and second transistors. A current through the conduction channel of the second transistor can be copied to the additional transistor such that the variable current through the conduction channel of the second transistor can be cancelled out in the translinear loop and the range of the linear-in-dB behaviour of the variable gain amplifier can be extended when compared with the prior art.

Figure 1:
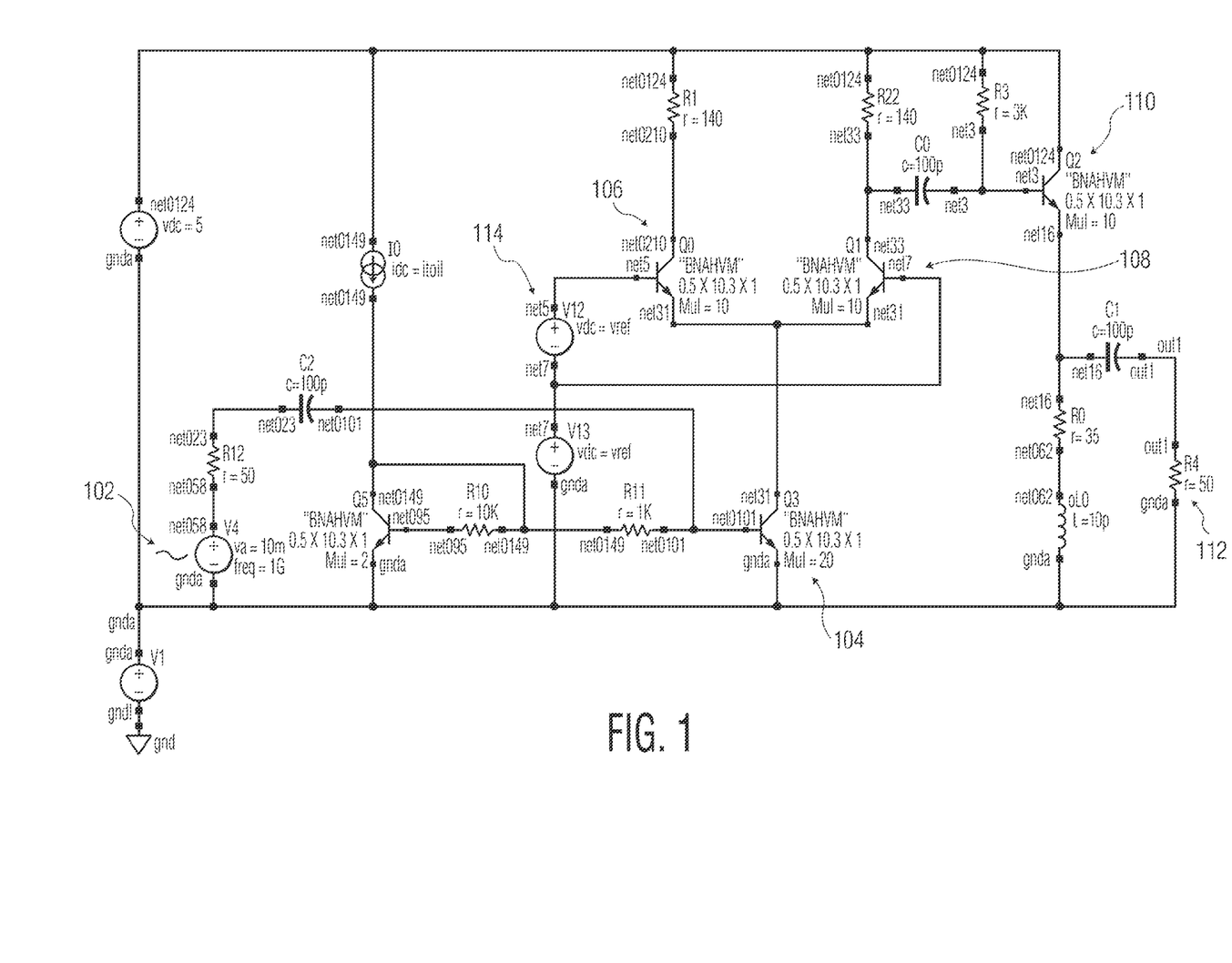
FIG. 1 illustrates a known current steering cascode.
Figure 2:
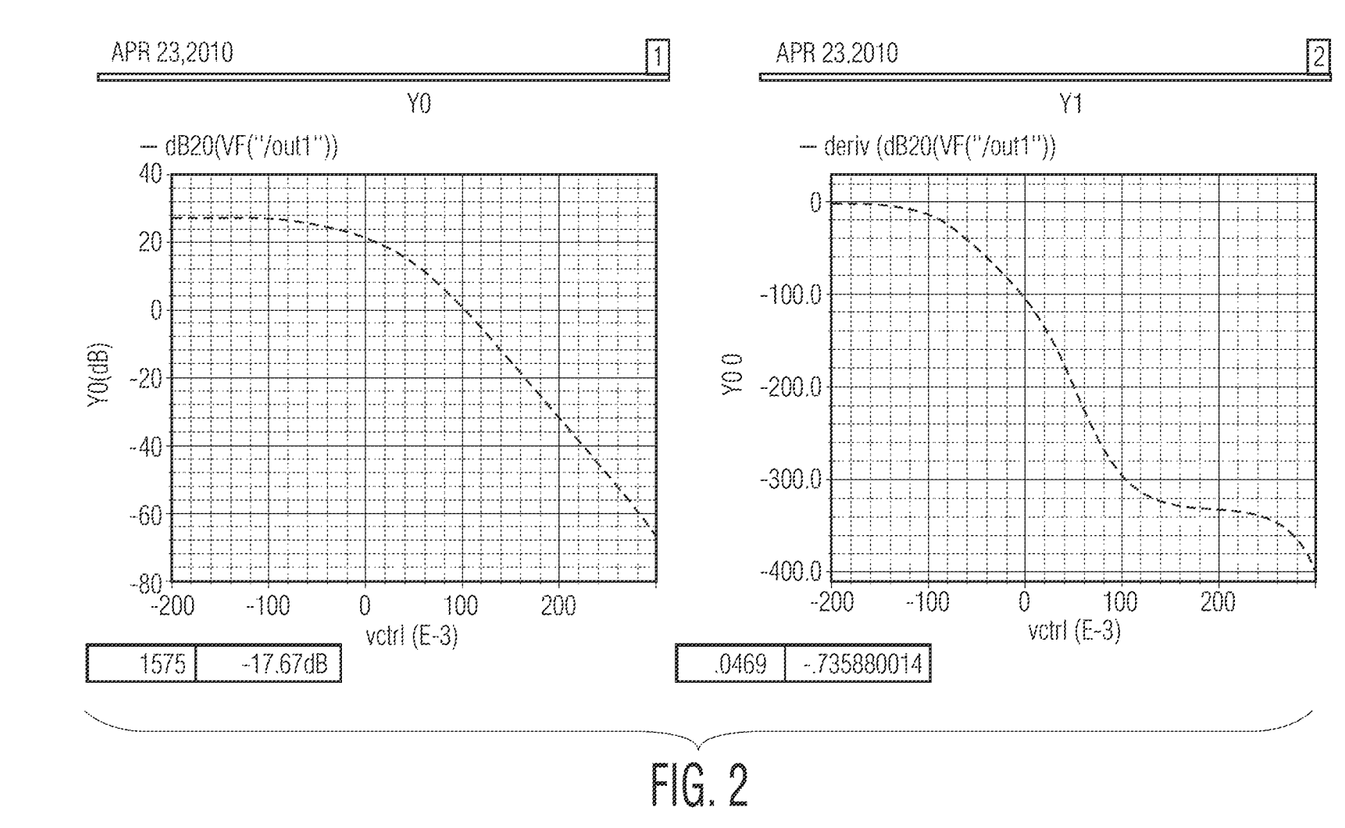
FIG. 2 illustrates graphically the performance of the circuit of FIG. 1.

FIG. 1 illustrates a known current steering cascode, which is an amplifier with variable gain. The current steering cascode comprises three transistors: a first transistor Q0 106, a second transistor Q1 108, and a third transistor Q3 104. FIG. 1 illustrates a circuit that is similar to a prior art circuit that is illustrated in FIG. 2 of "A SiGe BiCMOS Transmitter Module for IMT2001 Applications", Microwave and Wireless Components Letters, IEEE, Vol. 14, No. 8, Aug. 2004, the entire contents of which are hereby incorporated by reference.

A signal is provided by a voltage source V4 102 and is amplified by a common emitter transistor Q3 104. Transistor Q3 104 is loaded by two common base stage transistors Q0 106 and Q1 108. The output of transistor Q1 108 is fed to the base of an emitter follower transistor 110 Q2, which provides an output signal to a load resistor R4 112.

The transistor pair Q0 106 and Q1 108 act as a current divider. The amount of current through Q0 106 and Q1 108 is dependent on the voltage difference between their base terminals. This voltage difference is determined by a voltage source V12 114, which is referred to as vctrl and is connected between the base of Q0 106 and the base of Q1 108. If vctrl is 0 V, then the current from transistor Q3 104 is divided equally between transistor Q0 106 and transistor Q1 108; that is, the same amount of current flows through the conduction channel of transistor Q0 106 as flows through the conduction channel of transistor Q1 108. If vctrl is positive, then the current through transistor Q0 106 is larger than the current through transistor Q1 108 and consequently the output voltage at the load resistor R4 112 is reduced.

The circuit of FIG. 1 can be considered as providing a variable gain by dividing a current between two branches. The first branch is the conduction channel of transistor Q0 106 and the second branch is the conduction channel of transistor Q1 108. The conduction channel allows the flow of current between the emitter and the collector of the transistor in response to the base-emitter current. The ratio with which the current is split between the transistors is controlled by a control voltage (vctrl). The current through one of the branches (the branch that includes transistor Q1 108 in FIG. 1) is then used to contribute to the output of the variable gain amplifier, whereas the current through the other branch (the branch that includes transistor Q0 106 in FIG. 1) is not used to contribute to the output.

FIG. 2 illustrates graphically the relationship between the signal gain and the control voltage vctrl of the circuit of FIG. 1. The left-hand graph of FIG. 2 illustrates the gain of the amplifier circuit in decibels (dB) on the vertical axis versus the control voltage in millivolts (mV) on the horizontal axis. This may be referred to as the gain control curve of current steering cascode. The right-hand graph of FIG. 2 illustrates the derivative of the gain with respect to control voltage on the vertical axis versus the control voltage in millivolts on the horizontal axis. The right-hand graph may be referred to as the derivative of gain control curve.

It can be advantageous for the gain curve to be linear-in-dB. That is, to have a linear portion in a range of operation when plotted on a semi-logarithmic scale. This is because the control voltage is often generated in a system feedback loop that senses the signal voltage or power with a logarithmic detector. If the gain control curve has an exponential shape, which is equivalent to 'linear-in-dB', then the overall loop gain is constant (independent of signal level). This can be very important for system parameters such as loop stability and accuracy and can be seen as a significant advantage.

From FIG. 2 it can be seen that the curve in the left-hand graph is approximately linear-in-dB for control voltages in the range of 100 mV to 300 mV. For control voltages less than 100 mV the gain control curve is not linear. The signal gain for a control voltage of 100 mV is 0 dB and therefore, the maximum usable gain is 0 dB for linear-in-dB operation.

One or more embodiments disclosed herein can improve the range of control voltages for which the gain control curve can be used with linear-in-dB operation. In turn, this can improve the maximum usable gain under linear-in-dB operation. This can mean that an additional gain element in the prior art systems can be removed as sufficient gain can be provided by the variable gain amplifier circuit itself.

Figure 3:
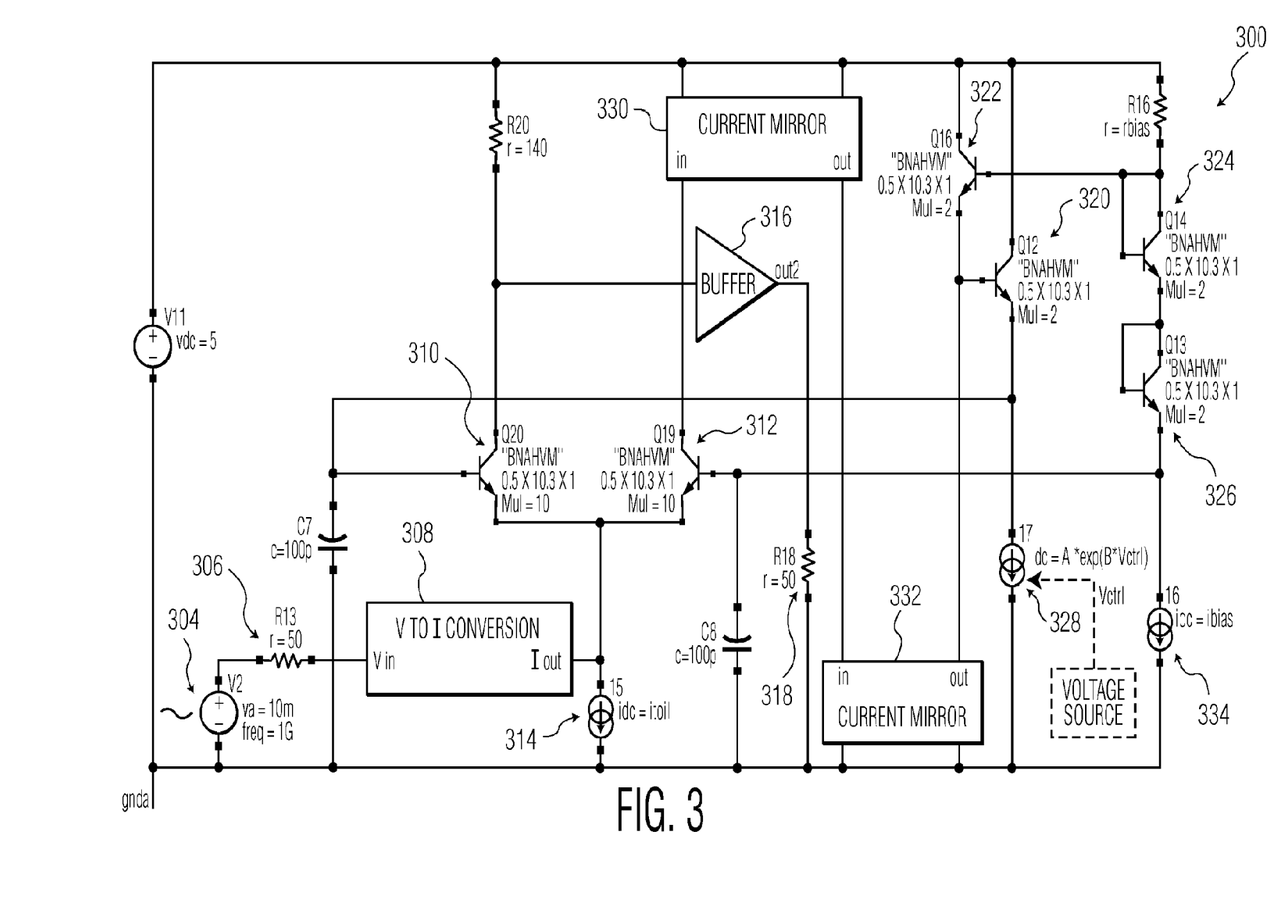
FIG. 3 illustrates a variable gain amplifier circuit according to an embodiment of the invention.

FIG. 3 illustrates a variable gain amplifier circuit 300 according to an embodiment of the invention. The circuit includes a translinear loop. A translinear loop (also known as a translinear circuit) is a circuit that applies the known translinear principle. The translinear loop in this example is a loop of bipolar base-emitter voltages (Vbe's) that comprises an equal number of forward and reverse transitions between the base and emitter of the transistors around the loop. The translinear loop in FIG. 3 includes two common base stage transistors: first transistor Q20 310 and second transistor Q19 312. These two transistors Q20 310 and Q19 312 provide functionality that is similar to that provided by the two common base transistors in known current steering cascodes. However, in this example, the common emitter stage transistor that is present in some known current steering cascodes is not required. Further details of the translinear loop are provided below.

The signal path from input to output consists of a signal source v2 304 connected to a first terminal of a source impedance R13 306. The other terminal of the source impedance R13 306 is connected to an input of a voltage to current (V to I) conversion block 308. The output of the V to I conversion block 308 is coupled to the emitters of a first transistor Q20 310 and a second transistor Q19 312. The output of the V to I conversion block 308 is also coupled to a direct current (DC) current source 15. The current source 15 provides the necessary bias current for the first transistor Q20 310 and the second transistor Q19 312.

In some examples, the V to I conversion block 308 may be may be implemented using a bipolar transistor in common emitter configuration. Such a transistor can also provide the bias current for the first transistor Q20 310 and second transistor Q19 312 and is described below with reference to FIG. 5. In this example, the V to I conversion functionality and the provision of a bias current may be combined in a single component.

The collector of the first transistor Q20 310 is connected to an input of a buffer 316. The output of the buffer 316 is provided to a load resistor R18 318 that represents the output of the circuit 300. Therefore, the current through the conduction channel between the emitter and the collector of the first transistor Q20 contributes to the output of the circuit and is proportional to the gain of the variable gain amplifier circuit 300.

In other examples, the buffer 316 may not be required and can be considered as an optional component.

The translinear loop of the variable gain amplifier circuit 300 consists of transistors Q19 312, Q20 310, Q12 320, Q16 322, Q14 324 and Q13 326. Starting from the base of the first transistor Q20 310, the translinear loop passes through the following base-emitter junctions:

base to emitter of the first transistor Q20 310;
emitter to base of the second transistor Q19 312;
emitter to base of 326;
emitter to base of transistor Q14 324;
base to emitter of additional transistor Q16 322;
base to emitter of control transistor Q12 320; and
back to the base of the first transistor Q20 310.

An important property of the translinear principle is that the product of the collector currents of the transistors in one direction is equal to the product of the collector currents of the transistors in the opposite direction. This holds true only if all transistors have equal emitter areas. If the emitter areas are different, then the currents must be divided by a scaling factor. In the schematic of FIG. 3, the scaling factor is equal to the 'mult' property of the transistors. The 'mult' property represents a relative value for the emitter areas of the transistors. For the transistors that are identified in FIG. 3 the values of 'mult' either have the value of 2 or 10.

For the circuit of FIG. 3, current flows through the transistors Q19 312, Q13 326 and Q14 324 in a first direction (from the emitter), and through the transistors Q16 322, Q12 320 and Q20 310 in a second direction (to the emitter). Therefore, and taking into account the 'mult' factors identified above, the currents through the transistors are related as follows:

$$I19/10 * I13/2 * I14/2 = I16/2 * I12/2 * I20/10 \quad (1)$$

Where:
Ixx represents the current through the conduction channel of transistor Qxx; and
each of the denominators of 2 and 10 represent the 'mult' factor of the associated transistor.

In this example it can be seen that the scaling ('mult') factors cancel out, and therefore:

$$I19 * I13 * I14 = I16 * I12 * I20 \quad (2)$$

As discussed above, the output current I20 is proportional to the gain of the circuit. In order to have the desired linear-in-dB gain, the current I20 should have an exponential behaviour with respect to the control voltage vctrl. This is achieved through use of a variable DC current source I7 328. The current source I7 328 is coupled between the emitter of the control transistor Q12 320 and ground. The value of the current source I7 328 is set such that it is proportional to the exponential of the control voltage vctrl. In this example, the value of the current source I7 328 is:

$$Idc = A * \exp(B * vctrl) \quad (3)$$

Where A and B are constants.

vctrl may be set by a voltage source or by a circuit with a voltage output (not shown in the Figures) in order to provide the control voltage for setting the gain of the variable gain amplifier circuit. A well-known way to implement the current source I7 uses a bipolar transistor in common emitter configuration, where vctrl is applied to the base, and the collector current provides the output current.

Therefore, based on the assumption that the base current can be ignored as negligible when compared with the current through the conduction channel of the transistor Q12 320:

$$I12 = A * \exp(B * vctrl) \quad (4)$$

In this way, the current I12 through the conduction channel of control transistor Q12 320 has an exponential behaviour with respect to the control voltage vctrl.

In an alternative embodiment, a further transistor can be used to convert the control voltage vctrl at its base to an exponential collector current in a similar way to the transistor Q3 104 in FIG. 1. The collector current of the further transistor can then be supplied to Q12.

Combining equations (2) and (4) above gives:

$$I20 = I19 * I13 * I14 / (I16 * constant1 * \exp(vctrl/Vt)) \quad (5)$$

Where:
Vt is the thermal voltage of the control transistor Q12 320 and equals kT/q; and constant1 represents a consolidation of all constants in the expression.

If I13, I14 and I16 were constant currents, then equation (5) could be rewritten as:

$$I20 = i19 * constant2 * \exp(-vctrl/Vt) \quad (6)$$

Where:
constant2 represents a consolidation of all constants in the expression.

Equation 6 represents similar performance to that of the circuit of FIG. 1. However, performance can be improved by making the current I16 proportional to I19. In which case, I16 in equation 5 can be replaced with I19, and the equation can be rewritten as:

$$I20 = I19 * I13 * I14 / (constant3 * I19 * \exp(vctrl/Vt)) \quad (7)$$

Where:
constant3 represents a consolidation of all constants in the expression.

Transistors Q13 326 and Q14 324 are stacked and therefore can be considered as having the same currents I13 and I14. In some examples, these transistors Q13 326, Q14 324 may be referred to as extra transistors. The two extra transistors Q13 326 and Q14 324 are provided in series with a DC current source I6 334. The DC current source I6 334 provides a constant bias current through transistors Q13 326 and Q14 324. The value of the DC current source I6 334 can be selected in accordance with design parameters/requirements; it can be used as a scaling factor in the gain transfer of equation (7) above. If currents I13 and I14 are constant, then equation (7) simplifies to:

$$I20 = constant4 * \exp(-vctrl/Vt) \quad (8)$$

Where:
constant4 represents a consolidation of all constants in the expression.

It can be seen from equation (8) that the output current I20 is now proportional to $\exp(-vctrl)$ independently of the variable current through second transistor Q19 312. This is because the variable current through second transistor Q19 312 has been copied to the additional transistor Q16 322 in the translinear loop such that it is cancelled out of the equation for the output current I20. The components of FIG. 3 that provide this functionality will now be described, and then the improved performance will be discussed with reference to FIG. 4.

The circuit of FIG. 3 includes a first current mirror 330. The input of the current mirror is connected to the collector of the second transistor Q19 312. The output of the first current mirror 330 is provided as an input to a second current mirror 332. The output of the second current mirror 332 is coupled to the emitter of the additional transistor Q16 322. In this example, two current mirrors 330, 332 are used so that the polarity of the current that is provided to the additional transistor 016 322 is correct. It will be appreciated that in other examples any suitable component or components may be used to copy the current through the second transistor Q19 312 to the additional transistor Q16 322. This may also be referred to as duplicating or creating a replica current.

In some examples it may be possible to connect the conduction channel of Q19 312 directly to the conduction channel of Q16 322. In these examples the current mirrors 330, 332 and transistors Q13 326 and 014 324 may not be required. In which case, the equation becomes:

$$I20=I16*I12*I19$$

However, in some scenarios the current levels through Q19 312 and Q16 322 can be different by orders of magnitude which can make the implementation impractical.

Therefore, in such circumstances, the inclusion of transistors Q13 and Q14 enables all of the bias currents to have the same order of magnitude.

Figure 4:
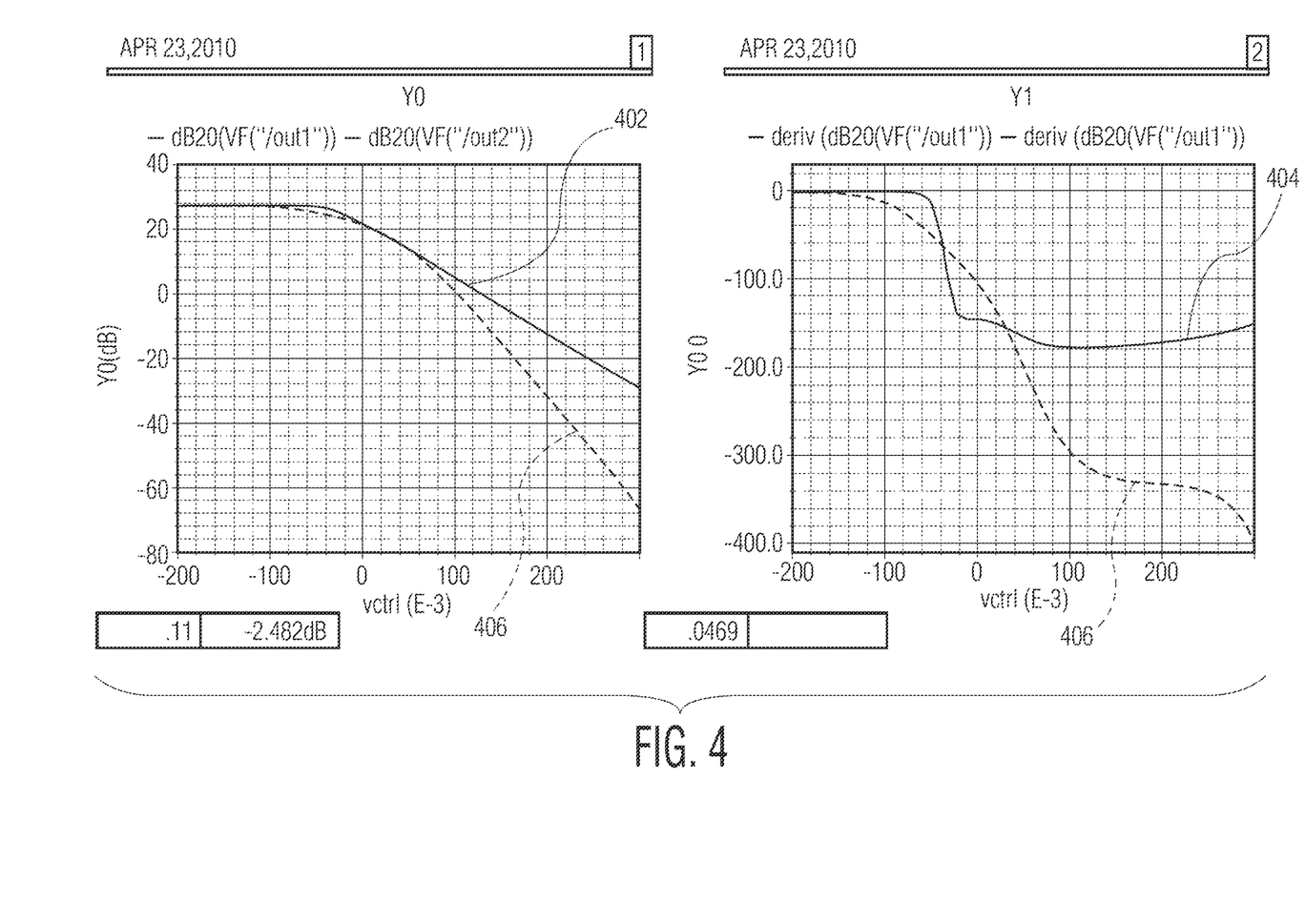
FIG. 4 illustrates graphically the performance of the circuit of FIG. 3.

FIG. 4 illustrates graphically the performance of the circuit of FIG. 3 as solid lines 402, 404. FIG. 4 also includes an illustration of the performance of the circuit of FIG. 1 as dashed lines 406, 408 for comparison purposes.

As with FIG. 2, the left-hand graph of FIG. 4 illustrates the gain control curve and the right-hand graph of FIG. 4 illustrates the derivative of gain control curve.

It can be seen from the gain control curve 402 in the left-hand graph of FIG. 4 that the linear behaviour of the circuit starts near the maximum gain of 28 dB when the control voltage is about −20 mV and extends to the maximum value of the control voltage that is shown in the graph of 300 mV. This nearly linear relationship is also evident from the derivative of the gain curve 404 in the right-hand graph of FIG. 4, which is reasonably constant between −20 mV and 300 mV.

It can be seen from FIG. 4 that the gain control curve 402 according to an embodiment of the invention has a much sharper roll-off from the maximum gain value than the prior art 406. This can represent an improvement in performance as it extends the maximum gain value that can be used in linear-in-dB operation.

The maximum usable gain that can be achieved in linear-in-dB operation by the circuit of FIG. 3 has been increased from 0 dB in the prior art to about 24 dB for this embodiment of the invention. This can be at the cost of a fractional increase in the supply current, which may be between 5% and 29% depending on the value of the control voltage.

Figure 5:
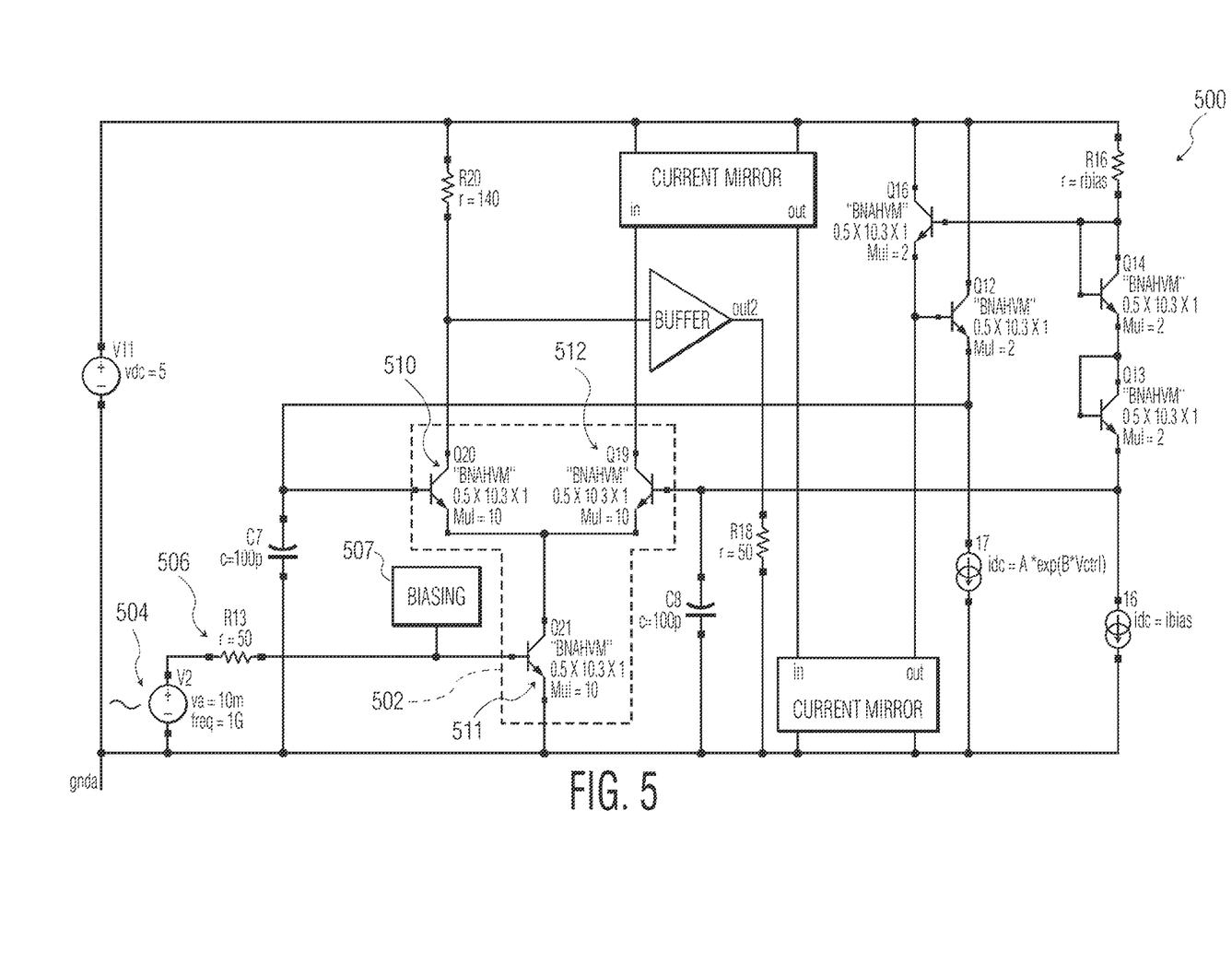
FIG. 5 illustrates a variable gain amplifier circuit according to another embodiment of the invention.

FIG. 5 illustrates a variable gain amplifier circuit 500 according to another embodiment of the invention. Those components that are present in FIG. 5, and have already been discussed above in relation to FIG. 3 will not be described again here.

The circuit 500 of FIG. 5 includes a current steering cascode 502. The current steering cascode includes the first and second transistors Q20 510, Q19 512 and a third transistor Q21 511. The first and second transistors Q20 510, Q19 512 are arranged as common base transistors. The third transistor is arranged as a common emitter transistor.

The collector of the third transistor Q21 511 is coupled to the emitters of the first and second transistors Q20 510, Q19 512. The emitter of the third transistor Q21 511 is coupled to ground. The base of the third transistor Q21 511 is connected to a first terminal of a source impedance R13 506. The second terminal of the source impedance R13 506 is connected to a signal source v2 504. Also connected to the base of the third transistor Q21 511 is a biasing component 507 in order to provide a desired bias at the base of the third transistor Q21 511.

The third transistor Q21 511 of FIG. 5 can be considered as replacing the V to I conversion block 308 and current source I5 314 of FIG. 3.

It will be appreciated that any components that are described herein as being coupled or connected could be directly or indirectly coupled or connected. That is, one or more components could be located between two components that are said to be coupled or connected whilst still enabling the required functionality to be achieved.

Embodiments of the invention can be applied in any variable gain amplifier (VGA), particularly VGAs that require a large gain range combined with a true linear-in-dB behaviour.

Possible application areas include:
wireless infrastructure, e.g. base stations;
microwave radion and VSAT;
test equipment and sensors; and
IF and RF applications in general.

The invention claimed is:
1. A variable gain amplifier circuit comprising:
a first transistor and a second transistor , wherein the first transistor and second transistor are arranged as common base transistors; and
an additional transistor that is configured to provide part of a translinear loop with the first and second transistors;
wherein a current through the conduction channel of the first transistor is configured to contribute to an output of the variable gain amplifier circuit current, and the circuit is configured such that a current through the conduction channel of the second transistor is copied to the additional transistor.
2. The circuit of claim 1, wherein the additional transistor is configured such that current flows through its base emitter junction in the opposite way to current that flows through the base emitter junction of the second transistor.
3. The variable gain amplifier circuit of claim 1,comprising a current steering cascode.comprising the first transistor and the second transistor.
4. The variable gain amplifier circuit of claim 3, wherein the current steering cascode further comprises a third transistor, wherein the third transistor is arranged as a common emitter transistor.
5. The variable gain amplifier circuit of claim 4, wherein the collector of the third transistor is connected to the emitter of both the first transistor and the second transistor.
6. The circuit of claim 1, further comprising a current minor that is configured to couple the current through the conduction channel of the second transistor to the conduction channel of the additional transistor.
7. The circuit of claim 1, further comprising two current mirrors that are configured to couple the current through the conduction channel of the second transistor to the conduction channel of the additional transistor.

8. The circuit of claim 1, further comprising a voltage source or a circuit with a voltage output that is configured to provide a control voltage for setting the gain of the variable gain amplifier circuit.

9. The circuit of claim 8, further comprising:
a current source; and
a control transistor that provides part of the translinear loop;
wherein the current source is configured to provide a current to the control transistor, the current having a value that has an exponential relationship with respect to the control voltage.

10. The circuit of claim 8, further comprising:
a control transistor that provides part of the translinear loop; and
a further transistor, wherein the conduction channel of the further transistor is provided in series with the conduction channel of the control transistor; wherein the further transistor is configured to receive the control voltage at its base, and provide a current to the control transistor, the current having a value that has an exponential relationship with respect to the control voltage.

11. The circuit of claim 10, wherein the further transistor is independent of the translinear loop.

12. The circuit of claim 1, wherein the variable gain amplifier circuit includes one or more extra transistors that are configured to form part of the translinear loop, wherein the number of transistors that are arranged as having current flow from base to emitter around the translinear loop is equal to the number of transistors that are arranged as having current flow from emitter to base around the translinear loop.

13. The circuit of claim 1, wherein one or more, or all of the transistors are bipolar junction transistors.

14. An integrated circuit comprising the circuit of claim 1.

* * * * *